(12) United States Patent
Cyman, Jr. et al.

(10) Patent No.: US 9,785,881 B2
(45) Date of Patent: Oct. 10, 2017

(54) SYSTEM AND METHOD FOR PRODUCING AN ELECTRONIC DEVICE

(71) Applicant: R.R. DONNELLEY & SONS COMPANY, Chicago, IL (US)

(72) Inventors: Theodore F. Cyman, Jr., Grand Island, NY (US); Nancy A. Lee, East Amherst, NY (US); Ali K. Cameron, Clarence, NY (US); Eric V. Palmer, Lancaster, NY (US)

(73) Assignee: R.R. Donnelley & Sons Company, Chicago, IL (US)

(*) Notice: Subject to any disclaimer, the term of this patent is extended or adjusted under 35 U.S.C. 154(b) by 0 days.

(21) Appl. No.: 15/043,885

(22) Filed: Feb. 15, 2016

(65) Prior Publication Data

US 2017/0236045 A1    Aug. 17, 2017

(51) Int. Cl.
| | |
|---|---|
| *G06K 19/06* | (2006.01) |
| *G06K 19/077* | (2006.01) |
| *G06F 17/50* | (2006.01) |
| *G06K 19/02* | (2006.01) |
| *G06K 1/00* | (2006.01) |

(52) U.S. Cl.
CPC ..... *G06K 19/0772* (2013.01); *G06F 17/5072* (2013.01); *G06K 1/00* (2013.01); *G06K 19/025* (2013.01); *G06K 19/06028* (2013.01); *G06K 19/06037* (2013.01); *G06K 19/07705* (2013.01)

(58) Field of Classification Search
CPC combination set(s) only.
See application file for complete search history.

(56) References Cited

U.S. PATENT DOCUMENTS

| 6,019,865 A | 2/2000 | Palmer et al. |
| 6,043,745 A | 3/2000 | Lake |
| 6,420,096 B1 | 7/2002 | Löbl et al. |
| 6,421,013 B1 | 7/2002 | Chung |
| 6,544,864 B2 | 4/2003 | Reeder et al. |
| 6,853,087 B2 | 2/2005 | Neuhaus et al. |

(Continued)

FOREIGN PATENT DOCUMENTS

| JP | 2003-277653 | 10/2003 |
| JP | 2011 151259 | 8/2011 |

(Continued)

OTHER PUBLICATIONS

U.S. Appl. No. 14/853,563, R.R. Donnelley & Sons Company

(Continued)

*Primary Examiner* — Christle I Marshall
(74) *Attorney, Agent, or Firm* — McCracken & Gillen LLC (57) ABSTRACT

A method and system for producing electronic label are disclosed. The electronic label includes a first substrate and a second substrate. Layout information associated with the electronic label is developed. The layout information is automatically processed to develop print commands, circuit layout information, and component placement information therefrom. Information is printed on the first substrate in accordance with the print information and a conductive trace is deposited on the second substrate in accordance with circuit layout information. Components are placed on the deposited conductive trace in accordance with the component placement information.

20 Claims, 10 Drawing Sheets (56) References Cited

U.S. PATENT DOCUMENTS

| | | | |
|---|---|---|---|
| 6,886,745 B2 | 5/2005 | Berrube et al. |
| 6,888,509 B2 | 5/2005 | Atherton |
| 6,924,781 B1 | 8/2005 | Gelbman |
| 7,042,357 B2 | 5/2006 | Girvin et al. |
| 7,057,495 B2 | 6/2006 | Debord et al. |
| 7,168,626 B2 | 1/2007 | Lerch et al. |
| 7,174,277 B2 | 2/2007 | Vock et al. |
| 7,204,425 B2 | 4/2007 | Mosher, Jr. et al. |
| 7,283,054 B2 | 10/2007 | Girvin et al. |
| 7,295,115 B2 | 11/2007 | Aljadeff et al. |
| 7,316,358 B2 | 1/2008 | Kotik et al. |
| 7,323,360 B2 | 1/2008 | Gonzalez et al. |
| 7,377,447 B2 | 5/2008 | Oberle |
| 7,417,541 B2 | 8/2008 | Lerch et al. |
| 7,586,412 B2 | 9/2009 | Takatama |
| 7,627,451 B2 | 12/2009 | Vock et al. |
| 7,639,135 B2 | 12/2009 | Arms et al. |
| 7,737,839 B1 | 6/2010 | Jones |
| 7,856,339 B2 | 12/2010 | Vock et al. |
| 7,895,739 B2 | 3/2011 | Niklas et al. |
| 8,126,675 B2 | 2/2012 | Vock et al. |
| 8,203,446 B2 | 6/2012 | Tsubota et al. |
| 8,219,466 B2 | 7/2012 | Gui et al. |
| 8,280,682 B2 | 10/2012 | Vock et al. |
| 8,317,084 B2 | 11/2012 | Bagai |
| 8,354,927 B2 | 1/2013 | Breed |
| 8,428,904 B2 | 4/2013 | Vock et al. |
| 8,590,799 B2 | 11/2013 | Liu |
| 8,618,914 B2 | 12/2013 | Bachman et al. |
| 8,640,259 B2 | 1/2014 | Jung et al. |
| 8,762,212 B2 | 6/2014 | Falls et al. |
| 9,030,724 B2 | 5/2015 | Agrawal et al. |
| 9,077,183 B2 | 7/2015 | Thomas et al. |
| 9,087,318 B1 | 7/2015 | Cordes et al. |
| 9,514,432 B2 | 12/2016 | Cyman, Jr. et al. |
| 2004/0066296 A1 | 4/2004 | Atherton |
| 2008/0077901 A1* | 3/2008 | Arsintescu ......... G06F 17/5045 716/122 |
| 2009/0048556 A1* | 2/2009 | Durand ................ A61K 9/0009 604/20 |
| 2011/0096388 A1* | 4/2011 | Agrawal ............... G02F 1/1506 359/268 |
| 2011/0131854 A1 | 6/2011 | Waltersdorf |
| 2012/0162945 A1* | 6/2012 | Schreiner ............ H05K 3/0058 361/781 |
| 2013/0009324 A1* | 1/2013 | Bartley ............... G06F 17/5068 257/774 |
| 2014/0282294 A1* | 9/2014 | Chen ................... G06F 17/5081 716/52 |
| 2016/0050762 A1 | 2/2016 | Cyman, Jr. et al. |
| 2016/0148899 A1 | 5/2016 | Ichimura |

FOREIGN PATENT DOCUMENTS

| | | |
|---|---|---|
| WO | WO-00-73082 | 12/2000 |
| WO | WO-03-006736 | 1/2003 |
| WO | WO-2014-067578 | 5/2014 |
| WO | WO 2015/004830 A1 | 1/2015 |

OTHER PUBLICATIONS

U.S. Appl. No. 15/344,939, R.R. Donnelley & Sons Company
U.S. Appl. No. 14/996,413, R.R. Donnelley & Sons Company
International Search Report and Written Opinion dated Nov. 25, 2015, for International Application No. PCT/US2015/045922, Applicant R.R. Donnelley & Sons Company (11 pages).
Non-final Office action dated Oct. 12, 2016, for U.S. Appl. No. 14/853,563, Applicant, R.R. Donnelley & Sons Company (9 pages).
International Search Report and Written Opinion dated Oct. 8, 2015, for International Application No. PCT/US2015/045089, Applicant, R.R. Donnelley & Sons Company (10 pages).
International Search Report and Written Opinion dated Oct. 20, 2015, for International Application No. PCT/US2015/045128, Applicant, R.R. Donnelley & Sons Company (10 pages).
International Search Report and Written Opinion dated Apr. 6, 2017, for International Application No. PCT/US2017/013464, Applicant, R.R. Donnelley & Sons Company (14 pages).
Duck, A., Dispensing SMD Adhesives: Rotary Pump Technology vs. Stencil Printing Technology, Electronic Packaging and Production, Aug. 1, 1996, pp. 41-44, vol. 36, No. 9, Cahners Publishing Co, Newton Massachusetts, U.S. (4 pages).

* cited by examiner

SYSTEM AND METHOD FOR PRODUCING AN ELECTRONIC DEVICE

FIELD OF DISCLOSURE

The present subject matter relates to producing electronic labels, and more particularly, to a system and method for producing an electronic label.

BACKGROUND

As electronic components have become smaller and cheaper, such components are being integrated into electronic labels. Such electronic labels may be used in various applications including, for example, product labels, shipping labels, shelf danglers or other advertising labels, and the like. Electronic labels may include switches that a user may actuate to configure a label, sensors for sensing a change in the environment where the label is disposed, and/or one or more indicators such as a light emitter, sound generator, vibration motor, and the like. For example, an advertising label may include one or more light emitters that are activated when the user actuates a switch. A shipping label may include a temperature sensor, and a light emitter or a sound generator that is activated when the temperature sensor detects that the temperature where the shipping label is disposed is outside a predetermined range.

Typically, designing an electronic label has involved a graphic designer to design the artwork and functionality of the electronic label, and an electronics technician or engineer to design a circuit that implements the functionality of the electronic label. For example, the graphic designer may identify where indicators should be placed and when such indicators should be actuated. Thereafter, the electronics technician may design the circuit that includes a processor, a sensor, and the indicators, and the electronic traces therebetween. The electronics technician may also develop the program code executed by the processor to obtain measurements from the sensor and, if necessary, actuate the indicators.

SUMMARY

According to one aspect, a method for producing an electronic device that includes a substrate comprises the step of providing a graphical user interface to develop layout information associated with the electronic device, wherein the layout information specifies a condition that the electronic device is adapted to sense, a location on the substrate of an indicator, and a characteristic of the indicator. The method includes the further step of processing the layout information to automatically select a processor, a first component adapted to sense the condition, and a second component in accordance with the characteristic of the indicator and to automatically develop from the layout information print commands, circuit trace information and component placement information. The component placement information includes placement information of the first component, the second component and the processor, and specification of interconnects between the processor and the first and second components. The method includes the further steps of depositing on the substrate at least one conductive trace in accordance with the circuit trace information, and placing the first and second components and the processor on the at least one deposited conductive trace in accordance with the component placement information.

According to another aspect, a system for producing an electronic device having a substrate includes a composition system a circuit layout generator, a printing system, and a component placement system. The composition system includes a graphical user interface to develop layout information associated with the electronic device, wherein the layout information specifies a condition that the electronic device is adapted to sense, a location on the substrate of an indicator, and a characteristic of the indicator. The circuit layout generator processes the layout information to automatically select a processor, a first component adapted to sense the condition, and a second component in accordance with the characteristic of the indicator and to automatically develop from the layout information circuit trace information and component placement information. The component placement information includes placement information of the first component, the second component, and the processor, and specification of interconnects between the processor and the first and second components. The printing system deposits on the substrate at least one conductive trace in accordance with the circuit trace information. The component placement system places components on the at least one deposited conductive trace in accordance with the component placement information.

Other aspects and advantages will become apparent upon consideration of the following detailed description and the attached drawings wherein like numerals designate like structures throughout the specification.

DETAILED DESCRIPTION

Figure 1A:
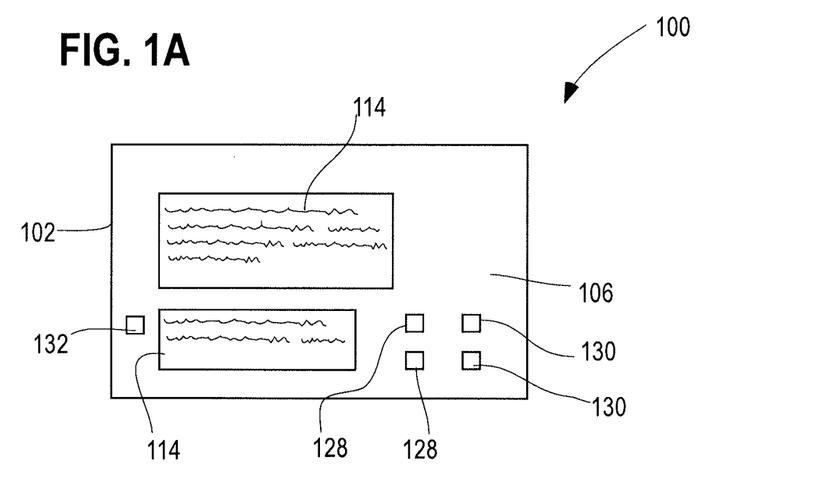
FIG. 1A is a planar view of an electronic label.
Figure 1B:
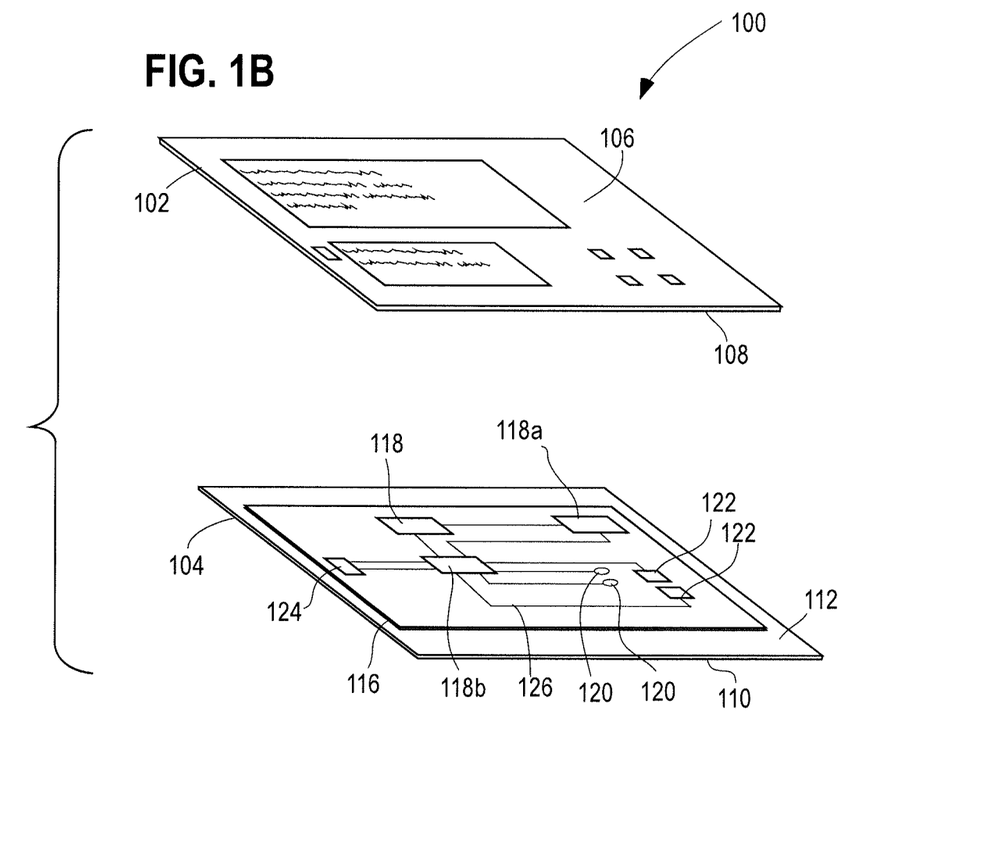
FIG. 1B is an isometric, exploded view of the electronic label of FIG. 1A.

Referring to FIGS. 1A and 1B, an electronic label 100 includes a first substrate 102 and a second substrate 104. The first substrate 102 has an outer surface 106 and an inner surface 108, and the second substrate 104 has outer surface 110 and an inner surface 112. The first substrate 102 and the second substrate 104 may selectively be made of flexible materials that are adhered or otherwise bonded together to form a flexible substantially flat member. The first substrate 102 and the second substrate 104 may comprise coated or uncoated paper, textiles, woven materials, plastics, films, gels, epoxies, fiberglass, and combinations thereof. Further, the substrates 102, 104 that comprise the electronic label 100 may be manufactured from identical or different materials.

In some embodiments, one or both of the outer surfaces 106 and 110 may include regions 114 in which information may be printed. Such printed information may include one or more of text, an image, tracking indicia such as a barcode or QR code, and the like. Such printed information in the regions 114 may be imprinted during the manufacture of the electronic label 100 using any printing technology apparent to those who have skill in the art, and may include lithography, gravure, flexography, inkjet, screen printing, a combination thereof, and the like.

In some embodiments, an electronic circuit 116 may be disposed between the first substrate 102 and the second substrate 104 before such substrates are joined together. Such electronic circuit 116 may include one or more components 118 such as a processor, a communications transceiver, a timer, a memory, and the like. The electronic circuit 116 may also include one or more electronic components such as one or more switch(es) 120, indicator(s) 122, and communication port(s) 124. In addition, the electronic circuit 116 may include one or more conductive trace(s) 126 that couple the components 118, switch(es) 120, indicator(s) 122, and communication port(s) 124 to one another.

The indicators 122 may include a visual indicator, such as a light-emitting diode (LED) that generates continuous or pulses of light. The indicators 122 may also include an electronic component that can display numeric, alphabetic, and/or alphanumeric characters. Such electronic component may include, for example, a seven-segment LED, a liquid crystal display (LCD), a plurality of individual LEDs, an organic light-emitting display (OLED), and/or the like. In some embodiments, the indicators 122 may include an audio-emitting device and/or a vibration device.

In some embodiments, the electronic circuit 116 may further include one or more communications ports 124 that may be used to download, into a memory of the electronic device 116, program code executable by the processor and or configuration information to control operation of the electronic label 100. Such memory may be a separate component, for example, the component 118*a* of the electronic circuit 116 or the memory may be integrated with a processor 118*b* of the electronic circuit 116.

As should be apparent to those who have skill in the art, the component(s) 118, switch(es) 120, indicator(s) 122, and communications port(s) 124 may be conductively coupled to one another by conductive traces 126. The conductive traces 126 may be deposited on the inner face 108 of the first substrate 102 or the inner face 112 of the second substrate 104. In some embodiments, a first portion of the conductive trace 126 may be deposited on the inner face 108 and a second portion of the conductive traces 126 may be deposited on the inner face 112. The electronic circuit 116, or a portion thereof, may be deposited on the inner faces 108,112 using a printing process such as, for example, lithography, gravure, flexography, inkjet, foil transfer, and/or a combination thereof. In some embodiments, the electronic circuit 116, or a portion thereof, may be applied to a carrier (not shown) separate from the first substrate 102 and the second substrate 104, and such carrier may be deposited on and/or secured to one or both of the the inner faces 108, 112. Other ways of disposing the electronic circuit 116 apparent to those who have skill in the art may be used.

In some embodiments, one or both of the first substrate 102 and the second substrate 104 may include one or more aperture(s) 128 through which the one or more of the switch(es) 120 may be accessed for actuation. Similarly, the first substrate 102 and/or the second substrate 104 may include one or more aperture(s) 130 through which output the indicator(s) 122, for example, visual indicators may be visible. In some embodiments, such apertures 128, 130 may be not be necessary if, for example, one or more of the switches 120 may be actuated and/or the output of the visual indicators 122 may be seen through the first substrate 102 and/or the second substrate 104.

In some embodiments, one or both of the first substrate 102 and the second substrate 104 may include one or more aperture(s) 132 through which the communication port(s) 124 may be accessed for transmitting program instructions and/or data to the electronic circuit 116. In some embodiments, the electronic circuit 116 may include components 118 to implement RFID, Bluetooth, IEEE 802.11, and/or other wireless transmission methods, and such methods may be used instead of a physical connection to transmit program instructions and/or data to the electronic circuit 116.

Figure 2:
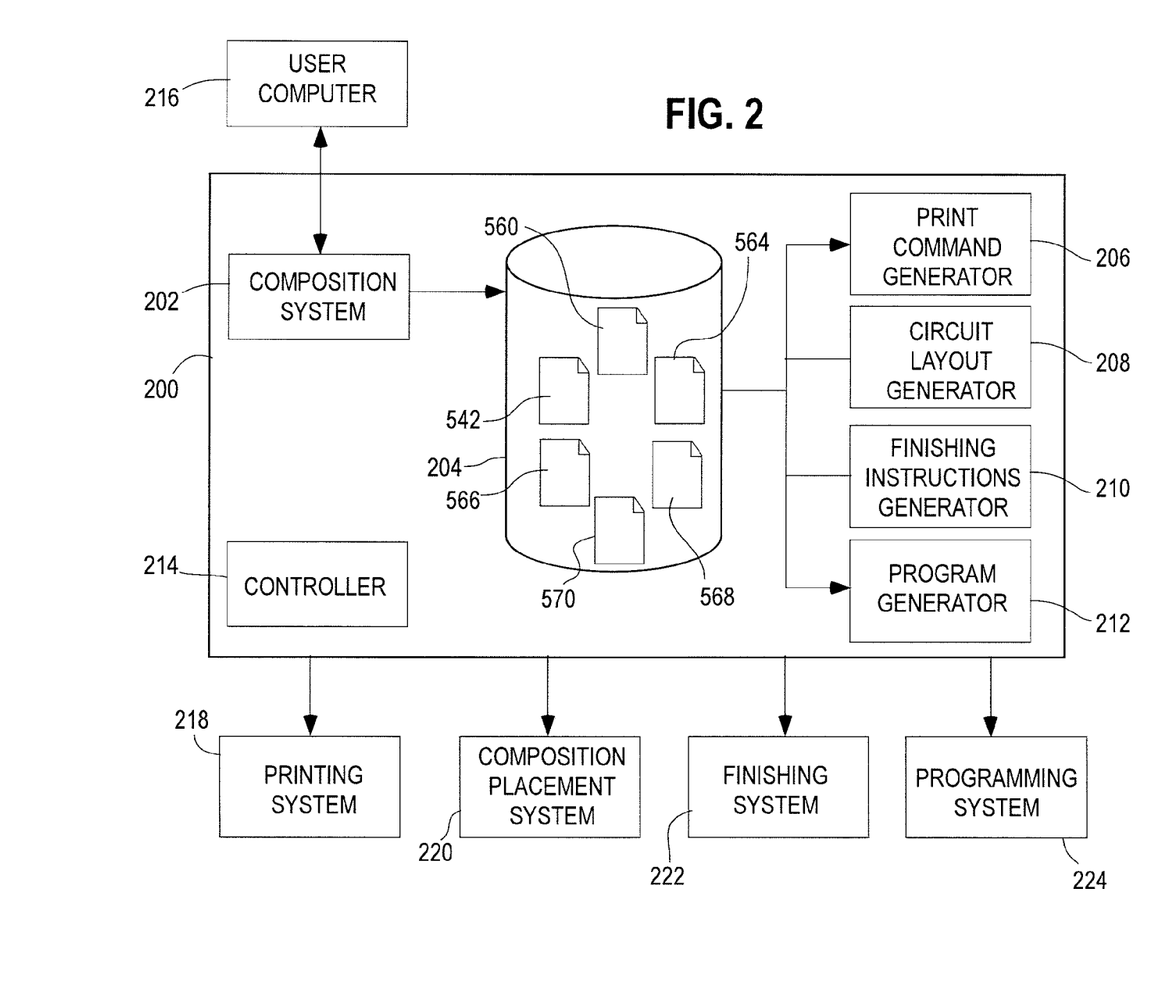
FIG. 2 is a schematic drawing of a system to develop the electronic label of FIG. 1A.

Referring to FIG. 2, an embodiment of a pre-production system 200 to produce the electronic label 100 includes a composition system 202, a storage device 204, a print command generator 206, a circuit layout generator 208, a finishing instructions generator 210, and a program generator 212. The pre-production system 200 also includes a controller 214 that coordinates the operation of the print command generator 206, the circuit layout generator 208, the finishing instructions generator 210 and the program generator 212, and facilitates communications between the pre-production system 200 and other systems involved in the production of the electronic label 100. Such other system may include a printing system 218, a component placement system 220, a finishing system 222, and a programming system 224.

A user may use the composition system 202 to specify layout information of the electronic label 100. Such layout information may specify printed information that is to appear in regions 114 of one or both of the outer surface 106 and the inner surface 108 of the first substrate 102, and/or one or both of the outer surface 110 and the inner surface 112 of the second substrate 104, the types of indicators 122 to be used the electronic label 100, the types and locations of the switches 120 present in the electronic label 100, and/or the location of the communication port 124. If the indicators 120 comprise one or more visual indicator(s) 122, the composition system 202 may allow the user to specify the locations of each such visual indicator 122.

The layout information specified using the composition system 202 may also include information regarding the behavior of the electronic label 100 in response to events. Such events may include actuation of one or more of the switches 120 and/or signals generated by components 118 that comprise the electronic circuit 116. Such signals may include a clock signal generated by a timer and/or detection of an environmental condition detected by a component 118 that includes a sensor. Such sensor components may include a temperature sensor, a humidity sensor, a motion sensor, an accelerometer, a light sensor, a chemical sensor, and the like. The composition system 202 may also allow the user to specify conditions that trigger the signal to be generated. Such trigger may be, for example, exposure to a temperature or humidity outside an acceptable range, motion in a direction outside a particular range or speed/acceleration outside of an acceptable range, exposure to a particular chemical, and/or the like.

Figure 3:
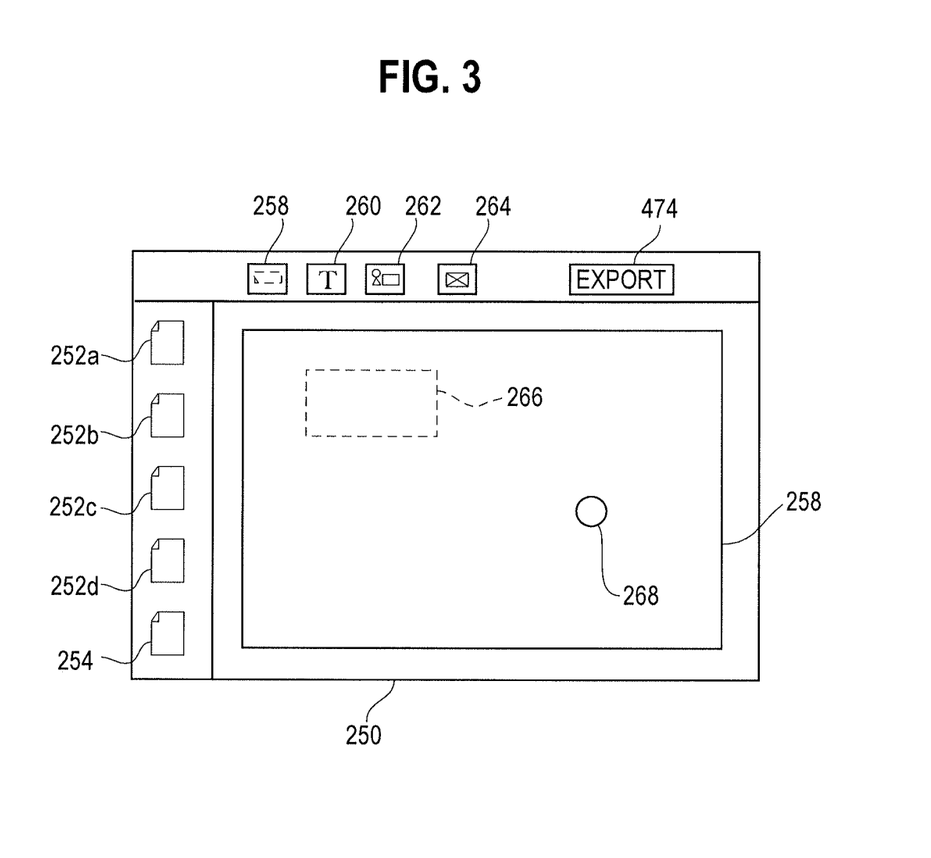
FIGS. 3-10 illustrate elements displayed on a screen by a component layout module of the system of FIG. 2.

Referring to FIG. 3, in one embodiment, the composition system 202 may display on a screen 250, one or more icon(s) 252 that represent one or more respective surface(s) on which information may be printed, and an icon 254 that represents an electronic circuit. Each icon 252 may be associated with one of the surfaces 106, 108, 110, and 112.

If the user selects one of the icons 252, the composition system 202 may display a representation 256 of the surface 106, 108, 110, or 112, associated with the selected icon 252. The composition system 202 may also display one or more buttons 258, 260, 262, and 264 on the screen 250. In one embodiment, selecting the button 258 may allow the user to specify a portion 266 of the representation 256 in which text and/or graphics that are to appear on the region 114 of the surface 106, 108, 110, or 112 associated with the representation 256. Thereafter, selecting the button 260 may allow the user to specify, for example, by typing on a keyboard associated with the composition system 202 or by identifying a text file, text is to appear in the region 114. Similarly, if the user selects the button 262, the user may be prompted to identify a graphics file, for example, an image that is to appear in the region 114. The composition system 202 may provide other ways of specifying textual and graphical contents of the surfaces 106, 108, 110, and 112 apparent to one of skill in the art.

If the user selects the button 264, the composition system 202 may allow the user to specify a location on the representation 256 for a cutout 268. Such cutout 268 may represent a portion of the substrate 102 and/or 104 that is to be removed, for example, by die-cutting to form, for example, the aperture 128 through which the switch 120 may be accessed, the aperture 130 through which output of the visual indicator 122 may be viewed, and/or the aperture 132 through which communication port 124 may be accessed.

Figure 4:
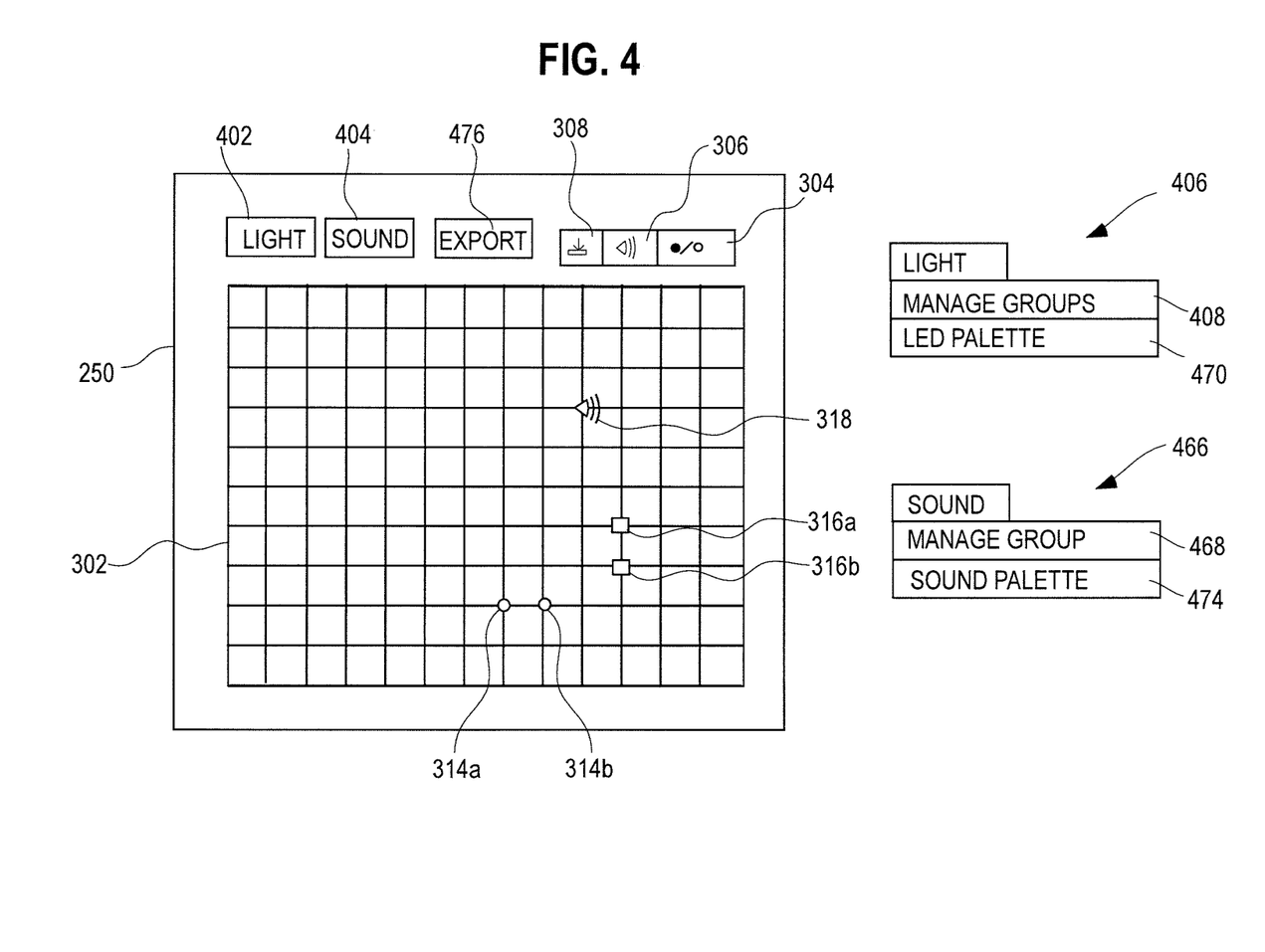

Referring to FIGS. 3 and 4, if the user selects the icon 254, the composition system 202 may display on the screen 250 a representation 302 of a surface on which the electronic circuit 116 is to be disposed. Such surface may be one of the surfaces 106, 108, 110, and 112, or another surface that is to be inserted between the substrates 102 and 104.

In some embodiments and as shown in FIG. 3, the representation 302 of the surface associated with the electronic circuit 116 may include a grid pattern that may facilitate positioning components thereon. The composition system 202 may also display on the screen 250, one or more icons 304, 306, and 308, which when selected, allow the user to identify locations on the substrate 102, 104 where a switch or sensor 120, a sound indicator 122, and a visual indicator 122, respectively, are to be placed. In particular, when the user selects one of the icons 304, 306, and 308, a pointer or cursor on the screen may change to a representation associated with such icon. The user may then click at a location on the representation 302 to indicate a corresponding location of substrate on which the electronic circuit 116 is to be disposed where such switch or sensor 120, or sound or visual indicator 122 is to be placed. Clicking at such location displays an icon associated with the switch or sensor 120, or sound or visual indicator 122 on the representation 302. For example, in the representation 302 illustrated in the FIG. 3, the user has placed icons corresponding to visual indicators at locations 314*a* and 314*b*, switches and/or sensors at locations 316*a* and 316*b*, and an audio indicator at a location 318.

When an icon of a component is placed on the representation 302, the composition system 202 may display on the screen 250 a dialog box in which the user may enter information regarding the characteristics and behavior of the component.

Figure 5:
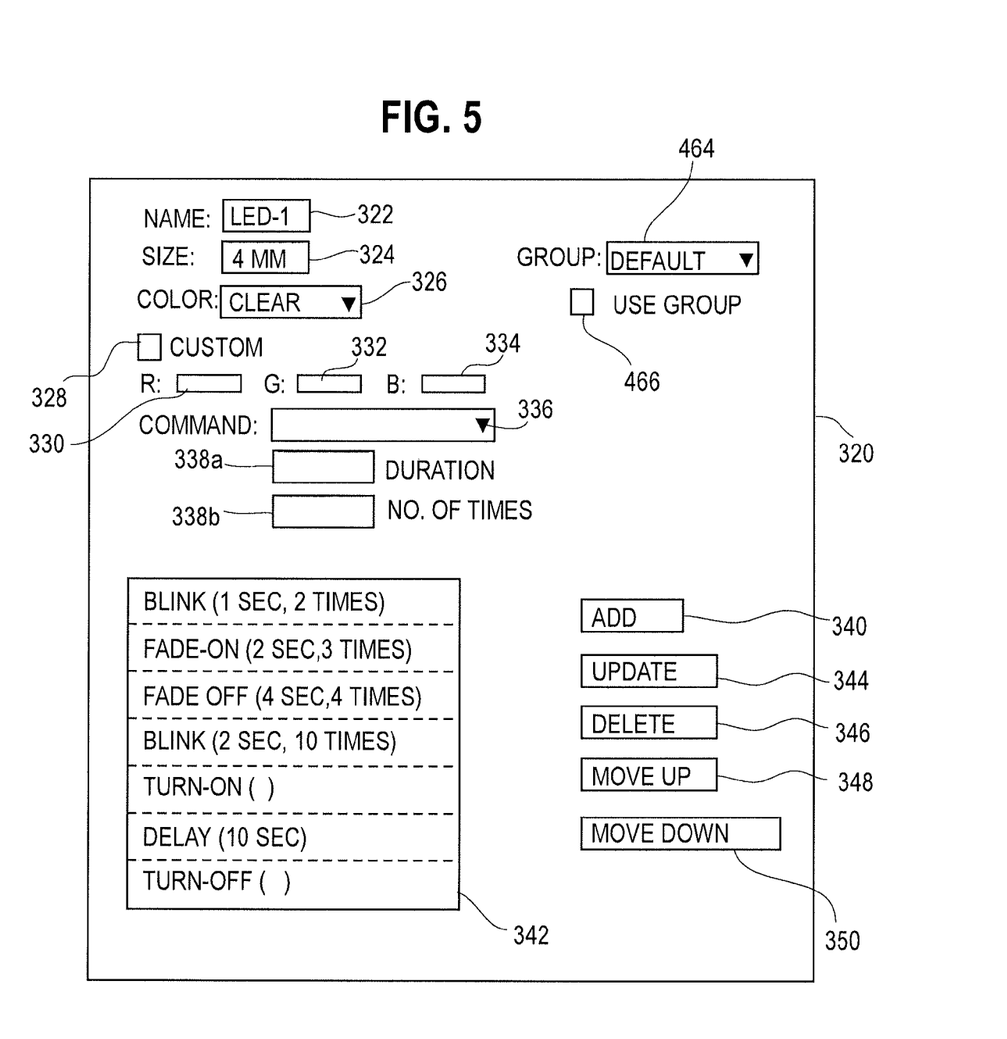

Referring to FIG. 5, if the icon that represents the visual indicator 122 is placed on the representation 302, a dialog box 320 may be displayed on the screen 250 that includes a text entry box 322 in which the user may enter a name associated with the visual indicator 122. The dialog box 320 may also include a text box 324 in which the user may specify the size of the visual indicator 122. If the user wishes to use a mono-color visual indicator 122, the user may select available colors of such indicator from a pull-down menu 326. Alternately, if the user wishes to use a visual indicator 122 that can generate various colors, the user may select a check box 328 and enter in the text boxes 330, 332, and 334 values of, for example, red, green and blue components, respectively, of the color of light to be emitted by the visual indicator 122.

The user may select how the visual indicator is to operate when actuated by selecting a command from the pull-down menu 336. Examples of commands from which the user may include a command to illuminate or blink the visual indicator 122, to fade on the visual indicator 122, fade off the visual indicator 122, to flash or blink the visual indicator 122, to hold a lit or unlit state of the visual indicator 122, and the like. One or more text box(es) 338 may be used to enter parameters associated with the command selected by the user from the pull down menu 336 specified by the user. The number of such boxes and the types of parameters that may be specified vary based on the selected command. For example, if the command selected is to blink the visual indicator 122, the parameters that may be entered in the text boxes 338 may include for how long the visual indicator 122 is to be illuminated, and the number of times the visual indicator 122 should be illuminated. If the number of times the visual indicator 122 is more than one, then the visual indicator 122 may appear to flash on and off.

After the user has selected the command using the pull-down menu 336 and entered the parameters associated with such command in the text box(es) 338, the user may select the button 340 to add the command into a list of commands displayed in a region 342 of the dialog box 320. The list of commands shown the region 342 are executed sequentially each time the visual indicator 122 specified by the dialog box 320 is actuated. For example, as illustrated in FIG. 4, each time the visual indicator 122 specified by the dialog box 320 is actuated, the visual indicator 122 will blink twice for one second; fade from off to on three times, each time taking two seconds; fade from on to off four times, each time taking four seconds; blink ten times, each time for 2 seconds; turn on; delay a further command for ten seconds, and thus remain on for the ten seconds; and turn off.

If the user selects a command in the list shown in the region 342, the parameters associated with such command are displayed in the text boxes 338. The user may modify such parameters and select the button 344 to update (or modify) the parameters associated with the selected command.

The user may also select a command in the list shown in the region 342, and select the button 346 to delete (or remove) the selected command from the sequence of commands that are executed when the visual indicator associated with the dialog box 320 is actuated.

The user may select a command in the list shown in the region 342, and then select the button 348 to move the selected command up (i.e., earlier) in the sequence of commands shown in the region 342. The user may select a command in the list shown in the region 342, and then select the button 350 to move the selected command down (i.e., later) in the sequence of commands shown in the region 342.

Figure 6:
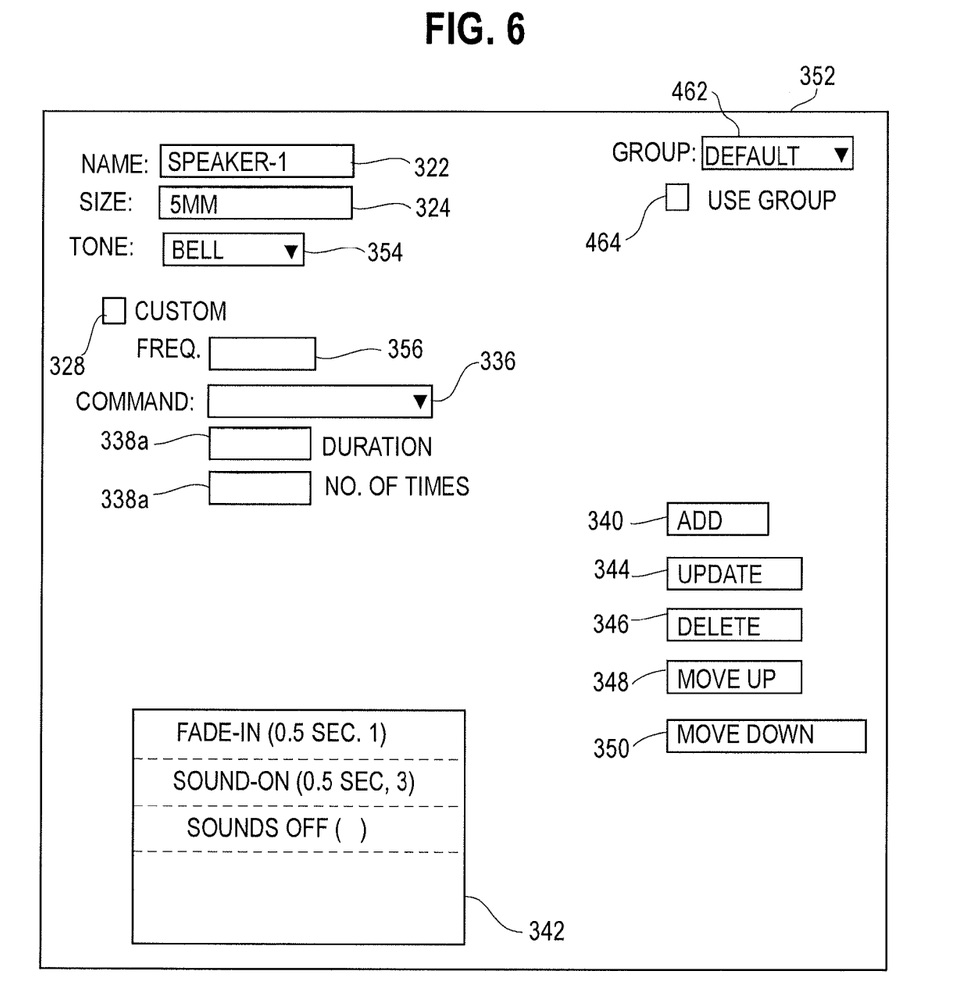

It will be apparent to one who has skill in the art that a dialog box similar to FIG. 4 may be used to specify the behavior of any other indicator specified using the user interface of FIG. 3. For example, referring to FIGS. 4 and 6, a dialog box 352 similar to the dialog box 320 may be used to specify the characteristics and behavior of an audio emitter. The elements of the dialog box 352 are identical to those of the dialog box 320, except the dialog box 352 replaces the color pull down menu 326 with a tone pull down menu 354, which allows the user to select a tone. In addition, instead of specifying the red, green, and blue components of a custom color using text boxes 330, 332, and 334, respectively, the dialog box 352 enables the user to specify a particular frequency using the text box 356. In addition, the pull down menu 336 of the dialog box 352 includes commands that are particular to audio generation rather than light emission. It should be apparent that other dialog boxes similar to the dialog boxes 320 and 352 may be used to specify the characteristics and behaviors of other indicators.

In some embodiments, the behaviors for multiple indicators 122 may be specified collectively rather than individually. In particular, such behaviors may be associated with a group, and indicators 122 placed on the representation 302 may be associated with the group.

Figure 7:
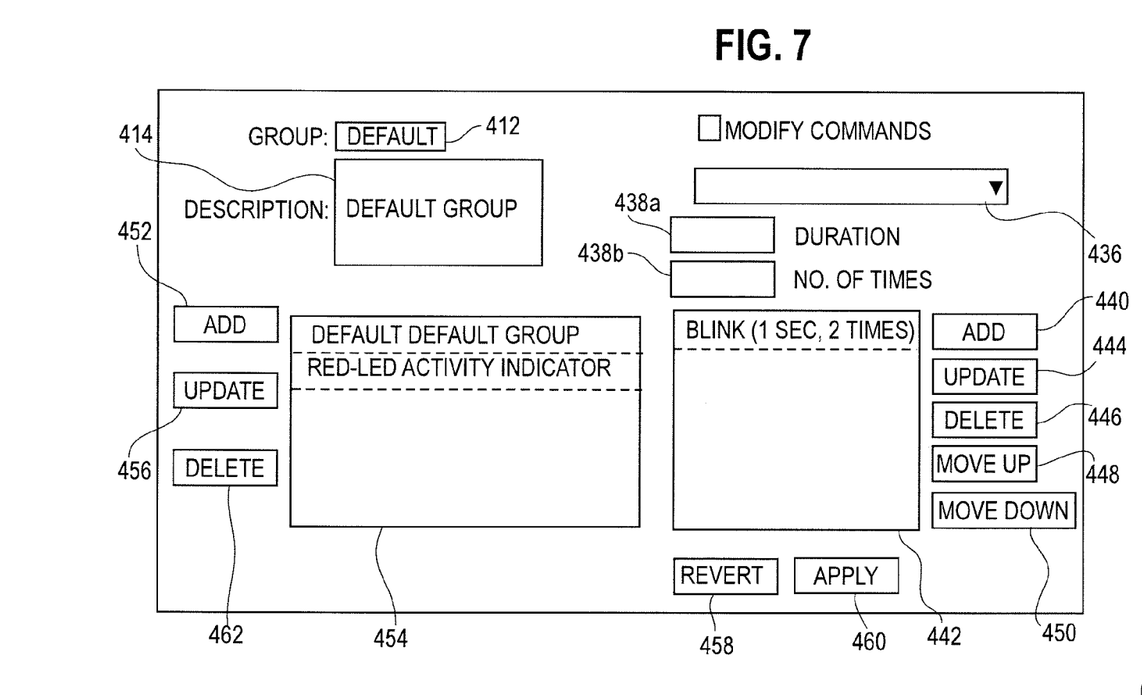

Referring to FIGS. 4 and 7, in some embodiments the composition module 202 may display on the screen 250, buttons 402 and 404. When the user selects button 402, a menu 406 associated with the text "LIGHTS" may be displayed. If the user then selects the menu item 408 associated with the text "MANAGE GROUPS," a dialog box 410 may be displayed on the screen 250.

The user may enter a name for the group in a text box 412 and an optional description for the group in a text box 414. The dialog box 410 includes a menu 436, one or more text box(es) 438, buttons 440 and 444-450, and a region 442, to define indicator behaviors of the group. Such menu, buttons and region may be used by the user in a manor identical to the way the menu 336, the text box(es) 338, the buttons 340 and 344-350, and the region 342 of the dialog boxes 320 (FIG. 5) and 352 (FIG. 6) may be used to define the behavior of an indicator, as describe above.

After specifying the behaviors associated with the group, the user may select the button 452 to add the group name and description to a region 454. The user may then select one of the names displayed in the region 454 and select the button 456. Doing so will display in the region 442 the behaviors associated with such group, and the user may use the menu 436, text boxes 438, and the buttons 440 and 442-450 to add additional behaviors or to modify the behaviors shown in the region 442.

The user may undo any such additional or modified behaviors by selecting the button 458, or associate such additional and/or modified behaviors with the group selected in the region 454 by selecting the button 460. The user may delete a group shown in the region 454 (and from the composition module 202) by selecting the button 462.

Referring to FIG. 5, any groups associated with a visual indicator may be displayed in a pop-up menu 464. The user may select the name of a group in such pop-up menu 464, and select the box 466 to indicate that the selected group defines the behavior of the indicator specified in the dialog box 320.

It should be apparent that a group may be specified for any other type of indicators. Referring to FIG. 4, selecting the button 404 may display the menu 466, and selecting the menu item 468 may display a dialog box (not shown) identical to the dialog box 410, except the commands are associated with audio emitters rather than a light emitter.

Figure 9:
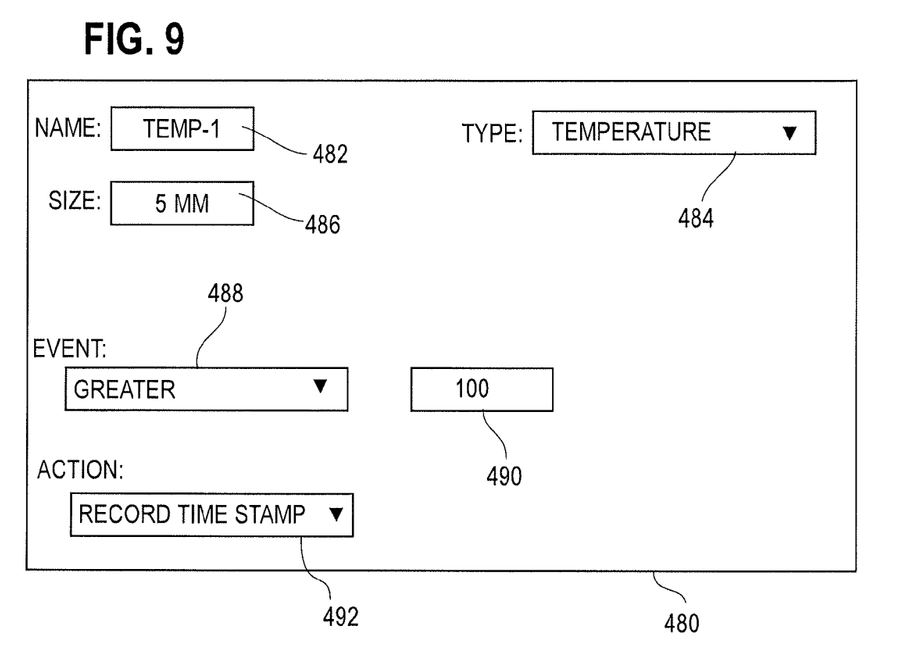

It should be apparent that characteristics of sensors and switches 120, and the behavior of the electronic label 100 in response to actuation of such sensors and switches 120, may be specified in a manner similar to that used to specify audio and visual indicators as described above. For example, referring to FIGS. 4 and 9, the composition module 202 may display a dialog box 480 to allow the user to specify the behavior of a sensor added to the representation 302 that is indicated by the icon 316. The dialog box 480 includes a text box 482 in which a name associated with the sensor may be entered, and a pull down menu 484 from which the type of sensor may be selected. The pull down menu 484 may allow selection of one of a predefined types of sensors recognized by the composition module 202 such a temperature sensor, as illustrated in FIG. 9, or a chemical sensor, a moisture sensor, a motion sensor, an accelerometer, and the like. A text box 486 allows the size of the sensor to be specified. The composition module 202 may check to confirm that the size specified in the text box 486 matches a predefined size associated with the type of sensor specified using the pull down menu 484.

The dialog box 480 also allows the user to specify the behavior of the electronic label 100 when the sensor detects an occurrence of a particular event. A pull down menu 488 and a text box 490 may be used to specify the particular event. The particular event may be, for example, if the sensor detects a condition greater than, equal to, or less than a threshold value specified in the text box 490. As illustrated in FIG. 9, the dialog box 480 may used to specify the event that the temperature sensor has detected a temperature greater than 100 degrees. A pull-down menu 492 may be used to specify a predetermined action to undertake and/or actuation of a visual or auditory indicator already specified. For example, the predetermined action may refer to a predefined program to execute upon detection of the event. Such predefined program may include record the event in a predefined memory location of the electronic label, for example, a memory location that may be accessible by the communication port 124 or an RFID reader. Other actions that may be specified include activate the electronic label 100, reset the electronic label 100, actuate a sequence of visual and auditory indicators, and the like.

Figure 10:
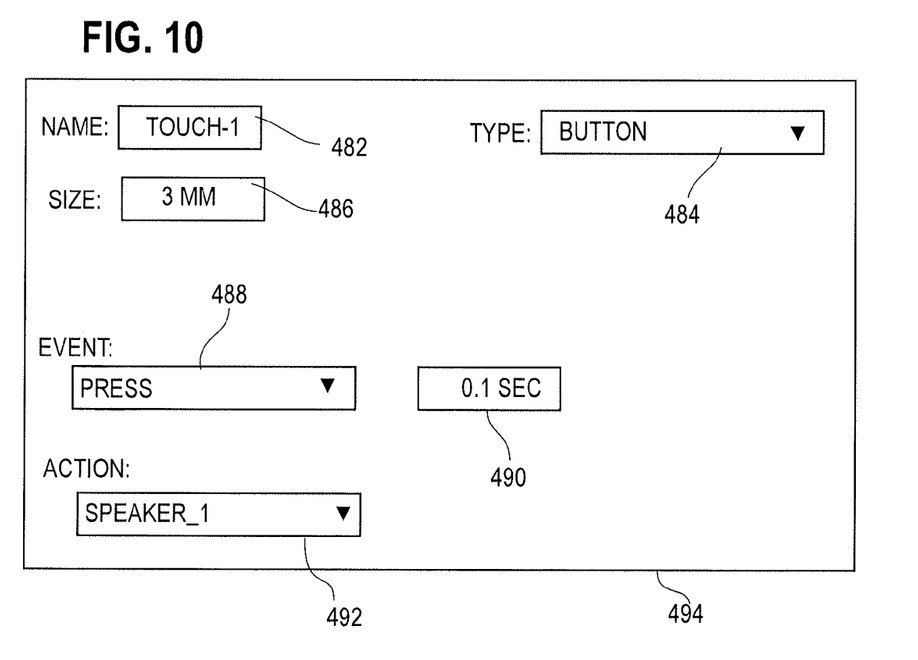

Referring to FIGS. 4, 9 and 10, if an icon of a switch is added to the representation 302, the composition module 202 may display a dialog box 494 to allow the user to specify the characteristics of the switch and the action to be undertaken by the electronic label 100 when such switch is actuated. The dialog box 494 is substantially identical to the dialog box 480 except that pull-down menu 484 allows selection of one of a plurality switch types supported by the composition module 202, the pull-down 488 allows selection of how the switch may be actuated, and the text box 490 allows the user to specify how long the event selected by the 488 must be undertaken for the switch to be considered actuated (to prevent accidental actuation of the switch).

Figure 8:
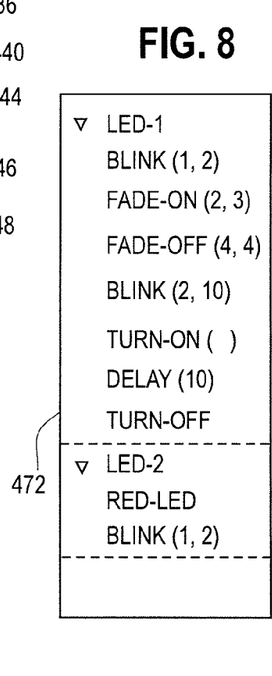

Continuing with FIG. 2, selecting the menu item 470 may display a dialog box 472 (FIG. 8) that lists each light emitter placed on the representation 302, and the behaviors associated with such light emitter. The user may also select the menu item 474 to display a similar dialog box (not shown) that lists each audio emitter, or other indicator associated with such menu item, placed on the representation 302.

After the user has completed specifying the layout of the electronic label 100, the user may select a button 476 to save the layout data 560 on the storage device 204.

In some embodiments, the layout data 560 may be a file, for example, a PDF file, an XML file, and the like stored on the storage device 204 that has all layout information therein. In other embodiments, the layout data 560 may comprise a plurality of separate files associated with one another. For example, the layout data 560 may include a main data file that includes references to other content files such as, for example, image files, text files, and the like. In some embodiments, the layout data 560 may include a container file such as, for example, a ZIP file, a TAR file, a PDF file, that includes files or data components therein.

In some embodiments, the composition module 202 may be a stand-alone program written in a programming language such as C, C++, Objective-C, Java, Visual Basic, and the like. In other embodiments, the composition system 202 may be a plug-in to extend the capabilities of another program such as InDesign, Illustrator and/or Acrobat, manufactured by the Adobe Corporation of San Jose, Calif., Word manufactured by the Microsoft Corporation of Redmond, Wash., or a comparable program known to those who have skill in the art.

To prepare one or more electronic labels 100 in accordance with the layout data 560, the controller 214 directs the print command generator 206 to develop print command data 562 from the layout data 560, the circuit layout generator 208 to develop circuit trace data 564 and component placement data 566 from the layout data 560, the finishing instructions generator 210 to generate finishing data 568 from the layout data 560, and the program generator 212 to develop program data 570 from the layout data 560.

The print command data 562 includes commands that direct the printing system 218 to print the information in the regions 114 of the substrates 102 and 104. The circuit trace data 564 include commands for imprinting or depositing the conductive traces 126 of the electronic circuit 116. In some embodiments the circuit trace data 564 may be combined with the print command data 562, especially if the print system 218 includes a print unit that is capable of printing using conductive ink or depositing conductive materials. In some embodiments, the combined print command data 562 may be used to control two separate printing systems 218, one that prints the textual and graphical information and another that prints the conductive traces. It will be apparent to those who have skill in the art that the print command data 562 and the circuit trace data 364 may include one or more rasterized images, postscript commands, PDF commands, and the like.

The component placement data 566 includes instructions to a component placement system to place electronic components 118, 120, and 122 on the electronic circuit 116. Such instructions identify each particular component 118, 120, or 122 and a location relative to the substrate (for example, substrates 102, 104) where such component is to be placed. The component placement data 566 may include, for example, a netlist that specifies the interconnections between the particular components 118, 210, and/or 122 that comprise the electronic circuit 116.

The finishing command data 568 includes data regarding the final size of the electronic label 100, and how the substrates 102 and 104 are to be brought together to form the electronic label 100. For example, the finishing command data 568 may specify that the substrates 102 and 104 be delivered as separates webs of material, adhered with one another, and die cut to form individual labels. Such finishing command data 568 may also specify, for example, any die cuts, for example to create the apertures 128, 130, and/or 132, that need to be performed on the substrates 102 and 104. The finishing command data 568 may be specified in a PDF file, for example. The aperture information and finishing parameters may be specified using PDF annotations and/or PDF pages.

The programming data 570 may include program instructions that are downloaded into the memory 118a or a memory associated with a processor 118b of the electronic label 100. Such program instructions may be downloaded into such memory using the communication port 124 or by using an RFID writer, if appropriate. The program instructions, when executed by the processor 118b, control the operation of the electronic label 100 as described above. The program generator 212 selects and adds common executable instructions that are common to all electronic labels 100 to the programming data 570. Such common executable instructions may include instructions to initialize common components of the electronic label 100, to initialize memory components of the electronic label 100, and the like. Thereafter, the common executable instructions are combined in the programming data 570 with particular executable instructions necessary to undertake the actions defined in the dialog boxes 480 (FIG. 9) and/or 494 (FIG. 10) described above. Such particular executable instructions are those associated with the program selected using the pull-down menus 492 in the dialog boxes 480 and/or 494. In one embodiment, the program generator 212 may associate an interrupt with each event identified in such dialog boxes, and, if necessary, include in the programming data 570 executable instructions that during initialization configure the switch or sensor to generate such an interrupt when the event occurs. The program generator 212 may also add to the programming data 570 instructions that load an interrupt table that associates such interrupt and the executable instructions that should be executed when the processor of the electronic label 100 receives the interrupt.

Figure 11:
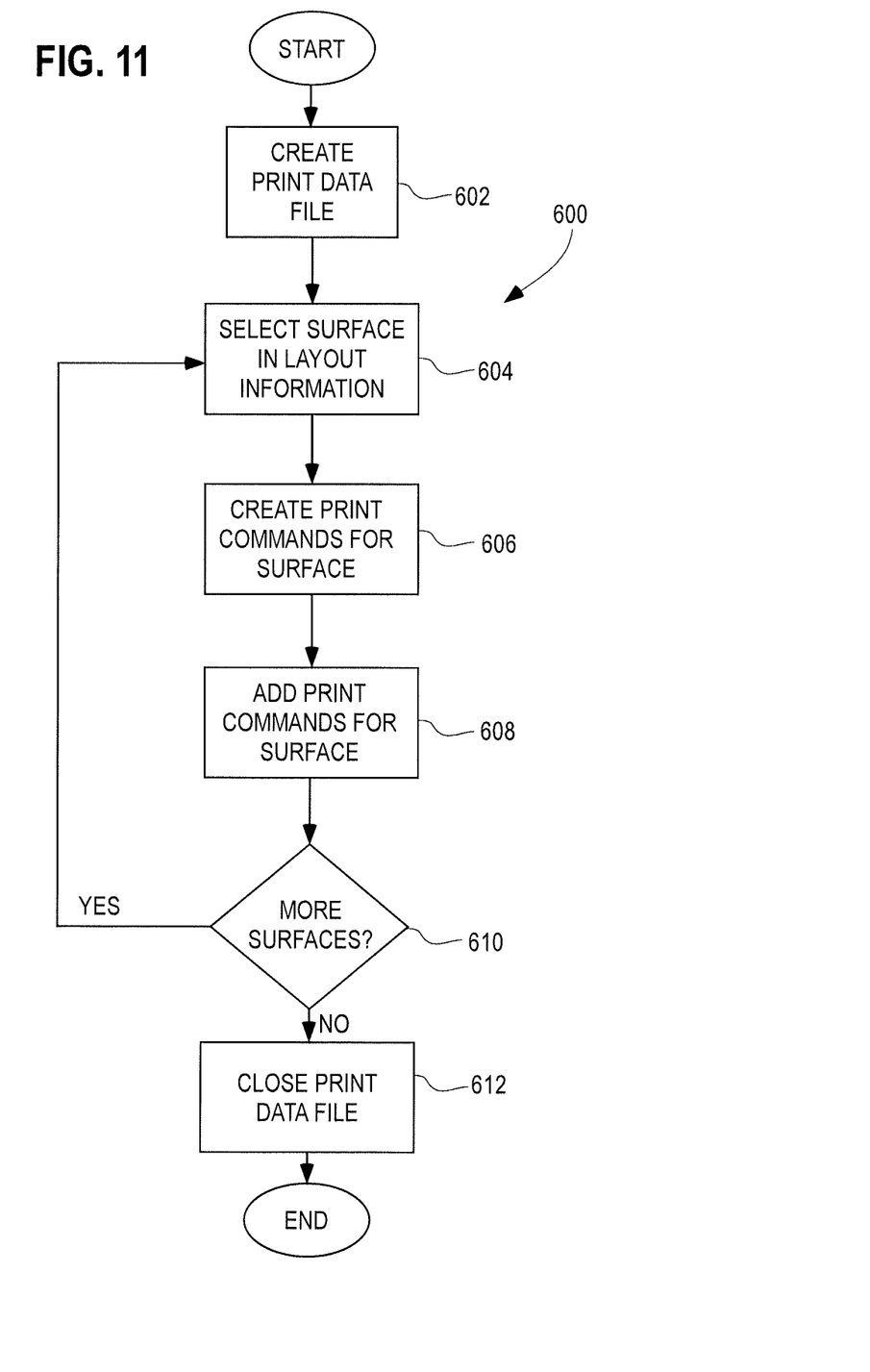
FIG. 11 is a flowchart of steps undertaken by a print data generator of the system of FIG. 2.

FIG. 11 shows a flowchart 600 of the steps undertaken in one embodiment of the print command generator 206 to develop the print command data 562 from the layout data 560. At block 602, the composition system 202 creates a file on the storage device 204 in which the print command data 562 may be stored. At block 604, the composition system 202 selects a representation of a surface in the layout data 560 on which information is to be printed. At block 606, the composition system 202 generates print commands for printing the information on the surface associated with the selected representation.

The composition system 202 then adds the print commands generated at the block 606 to the file created to hold the print command data 362, at block 608. At block 610 the composition system 202 determines if there are any additional representations of surfaces in the layout file for which print commands need to be generated. If there are, the composition system 202 proceeds to block 604.

Otherwise the composition system 202 closes the file in which the print command data 562 are stored.

Figure 12:
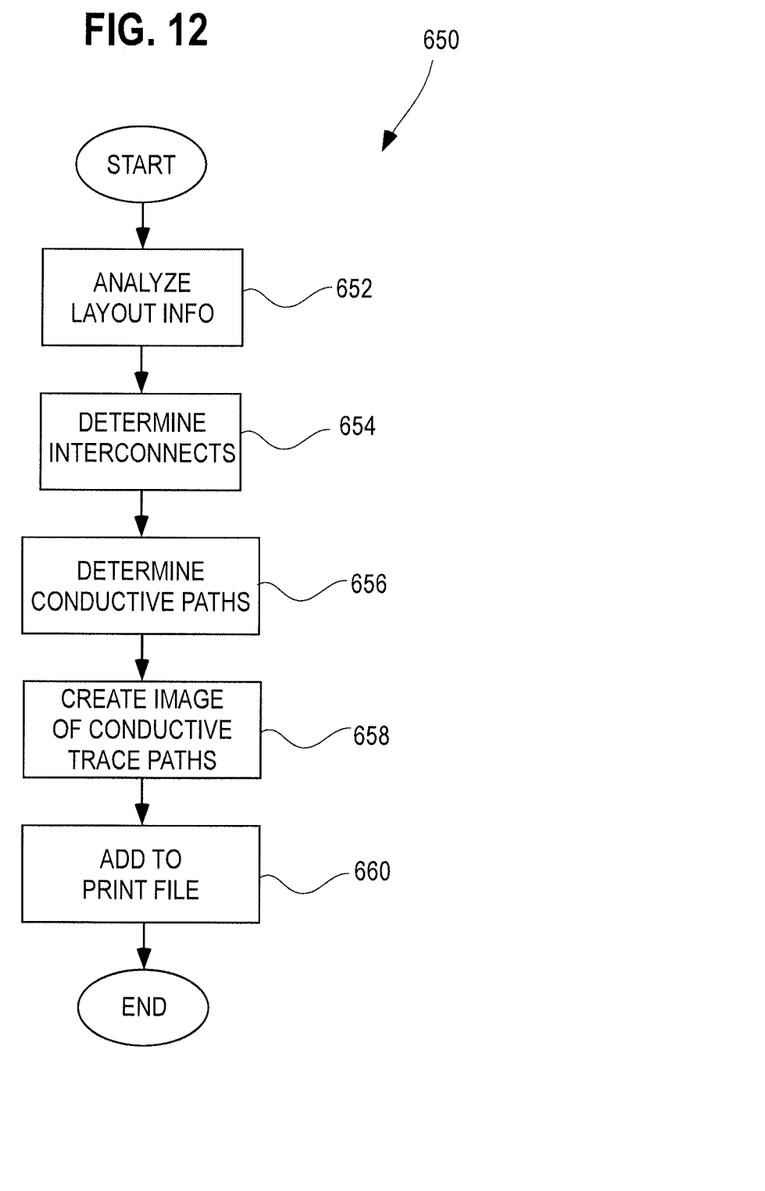
FIG. 12 is a flowchart of steps undertaken by a circuit layout generator of the system of FIG. 2.

Referring to FIG. 12, to generate the circuit layout data 564 and the component placement data 566 from the layout data 560, the circuit layout generator 208 analyzes, at block 600, the layout data 560 associated with the electronic circuit 116 specified by the user and determines the types of indicators 120, switches 122, and/or communication port(s) 124 that comprise the electronic circuit 116, and the locations of each such component 120, 122, and/or 124 relative to the substrates 102 and/104. In addition, the circuit layout generator 208 determines other components 118, including one or more of a processor, a memory, a communication port, a sensor, and the like necessary to implement the functionality of the electronic label 100 as specified by the user. Further, the composition system 202 determines the interconnections between the electronic component(s) 118, indicator(s) 120, switch(es) 122, and/or communication port(s) 124. Information regarding such components 118, 120, 122, and 124 and the interconnections therebetween is supplied to a circuit trace layout program to determine the paths of the conductive traces 126 of the electronic circuit 116.

In one embodiment, as described above the circuit layout data 564 may include a netlist having information regarding the components 118, 120, 122 and 124, and the interconnections therebetween, of the electronic circuit 116. The circuit layout generator 208 may provide such netlist to a layout program such as OrCad PCB manufactured by Cadence Design Systems, Inc., of San Jose, Calif., or Xpedition PCB Layout manufactured by the Mentor Graphics Corporation, of Wilsonville, Oreg. Such layout programs determine conductive traces between components and generate a drawing file that represents the electronic circuit 116, for example. Such drawing file may be a PDF file or an image file such as, for example, a PNG, a TIFF, a BMP, or a JPEG image file. It should be apparent to those of skill that other layout programs may be used and that drawing file may be generated in other formats.

Referring once again to FIG. 2, after the pre-production system 200 has developed the print command data 562 and the circuit trace data 564 necessary to direct the printing system 218 to print the information and conductive traces on the substrates 102 and 104, such data 562 and 564 may be transmitted to the printing system 218 for printing. The substrate 102 and/or 104 on which the conductive trace has been printed may be loaded into a component placement system 220 and the component placement data 566 may be transmitted to the component placement system 220. Thereafter, the component placement system 220 may be operated in accordance with the component placement data 566 to place and adhere the components 118, 120, 122, and/or 124 on the substrate(s) 102 and/or 104 or another substrate on which the electronic circuit 116 is disposed.

After the components 118, 120, 122, and/or 124 have been placed on the substrate, the printed substrate having such components thereon may be transported to the finishing system 222, with any other substrates that comprise the electronic label 100. The finishing data 368 may be transmitted to the finishing system 222, and the finishing system operates 222 in accordance with the finishing data 568 to combine the substrates that comprise the electronic label 100 and produce the electronic label 100.

After the electronic label 100 has been produced, the electronic label 100 may be loaded into the programming system 224 to download thereto the executable instructions specified by the program data 570, as described above. Following programming, the electronic label 100 may be tested to confirm that the components 118, 120, 122, and/or 124 thereof are operational and that the electronic label 100 functions as specified by the user using the pre-production system 200.

It will be understood and appreciated that one or more of the systems, modules, generators, processes, sub-processes, and process steps described in connection with FIGS. 2-10 may be performed by hardware, software, or a combination of hardware and software on one or more electronic or digitally-controlled devices. The software may reside in a software memory (not shown) in a suitable electronic processing component or system such as, for example, one or more of the functional systems, controllers, generators, devices, components, modules, or sub-modules schematically depicted in FIGS. 2-10 The software memory may include an ordered listing of executable instructions for implementing logical functions (that is, "logic" that may be implemented in digital form such as digital circuitry or source code, or in analog form such as analog source such as an analog electrical, sound, or video signal). The instructions may be executed within a processing module or controller (e.g., the composition system 202, the print command generator 206, the circuit layout generator 208, the finishing instructions generator 210, the program generator 212, and the controller 214), which includes, for example, one or more microprocessors, general purpose processors, combinations of processors, digital signal processors (DSPs), field programmable gate arrays (FPGAs), or application-specific integrated circuits (ASICs). Further, the schematic diagrams describe a logical division of functions having physical (hardware and/or software) implementations that are not limited by architecture or the physical layout of the functions. The example systems described in this application may be implemented in a variety of configurations and operate as hardware/software components in a single hardware/software unit, or in separate hardware/software units.

The executable instructions may be implemented as a computer program product having instructions stored therein which, when executed by a processing module of an electronic system, direct the electronic system to carry out the instructions. The computer program product may be selectively embodied in any non-transitory computer-readable storage medium for use by or in connection with an instruction execution system, apparatus, or device, such as a electronic computer-based system, processor-containing system, or other system that may selectively fetch the instructions from the instruction execution system, apparatus, or device and execute the instructions. In the context of this document, computer-readable storage medium is any non-transitory means that may store the program for use by or in connection with the instruction execution system, apparatus, or device. The non-transitory computer-readable storage medium may selectively be, for example, an electronic, magnetic, optical, electromagnetic, infrared, or semiconductor system, apparatus, or device. A non-exhaustive list of more specific examples of non-transitory computer readable media include: an electrical connection having one or more wires (electronic); a portable computer diskette (magnetic); a random access, i.e., volatile, memory (electronic); a read-only memory (electronic); an erasable programmable read only memory such as, for example, Flash memory (electronic); a compact disc memory such as, for example, CD-ROM, CD-R, CD-RW (optical); and digital versatile disc memory, i.e., DVD (optical).

It will also be understood that receiving and transmitting of data as used in this document means that two or more systems, devices, components, modules, or sub-modules are capable of communicating with each other via signals that travel over some type of signal path. The signals may be communication, power, data, or energy signals, which may communicate information, power, or energy from a first system, device, component, module, or sub-module to a second system, device, component, module, or sub-module along a signal path between the first and second system, device, component, module, or sub-module. The signal paths may include physical, electrical, magnetic, electromagnetic, electrochemical, optical, wired, or wireless connections. The signal paths may also include additional systems, devices, components, modules, or sub-modules between the first and second system, device, component, module, or sub-module.

INDUSTRIAL APPLICABILITY

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

We claim:

1. A method for producing an electronic device that includes a substrate, the method comprising the steps of:
   providing a graphical user interface to develop layout information associated with the electronic device, wherein the layout information specifies a condition that the electronic device is adapted to sense, a location on the substrate of an indicator, and a characteristic of the indicator;
   processing the layout information to automatically select a processor, a first component adapted to sense the condition, and a second component in accordance with the characteristic of the indicator and to automatically develop from the layout information circuit trace information and component placement information, wherein the component placement information includes placement information of the first component, the second component and the processor, and specification of interconnects between the processor and the first and second components;
   depositing on the substrate at least one conductive trace in accordance with the circuit trace information; and
   placing the first and second components and the processor on the at least one deposited conductive trace in accordance with the component placement information.

2. The method of claim 1, wherein the step of processing the layout information comprises the step of generating a netlist, wherein the netlist identifies components that comprise the electronic device and the interconnections therebetween.

3. The method of claim 2, wherein the step of processing the layout information comprises supplying the netlist to an automated circuit layout program, and receiving circuit trace information from the circuit layout program.

4. The method of claim 1, wherein the substrate comprises a first substrate and the electronic device includes a second substrate, and processing the layout information includes developing from the layout commands print commands associated with print information, further including the step of printing on at least one of the first substrate and the second substrate in accordance with the print commands.

5. The method of claim 4, wherein the step of processing the layout information comprises combining the circuit trace information with the print commands into a single file.

6. The method of claim 1, wherein the layout information includes information regarding a location on the second and behavior of a sensor.

7. The method of claim 6, wherein the layout information includes information regarding an action undertaken by the electronic device in response to actuation of the sensor.

8. The method of claim 1, wherein the indicator is one of a visual indicator, an auditory indicator, or a vibration motor.

9. The method of claim 1, comprising the further step of finishing the substrate to produce a finished electronic device, wherein finishing the substrate comprises one or more of joining the first substrate with another substrate, die-cutting the substrate, die-cutting the joined substrates, and creating an aperture in the substrate.

10. The method of claim 1, wherein processing the layout instructions includes the step of generating from the layout information executable instructions to download to the electronic device, and the method comprises the further step of downloading the executable instructions into a memory of the electronic device.

11. A system for producing an electronic device that includes a substrate, comprising:
   a composition system that includes a graphical user interface to develop layout information associated with the electronic device, wherein the layout information specifies a condition that the electronic device is adapted to sense, a location on the substrate of an indicator, and a characteristic of the indicator;
   a circuit layout generator that processes the layout information to automatically select a processor, a first component adapted to sense the condition, and a second component in accordance with the characteristic of the indicator and to automatically develop from the layout information circuit trace information and component placement information, wherein the component placement information includes placement information of the first component, the second component and the processor, and specification of interconnects between the processor and the first and second components;
   a printing system that deposits on the substrate at least one conductive trace in accordance with the circuit trace information; and
   a component placement system that places the first and second components and the processor on the at least one deposited conductive trace in accordance with the component placement information.

12. The system of claim 11, wherein the circuit layout generator creates a netlist, wherein the netlist identifies components that comprise the electronic device and the interconnections therebetween.

13. The system of claim 12, further including an automated circuit layout program that generates circuit trace information.

14. The system of claim 11, wherein the substrate includes a first substrate and the electronic device includes a second substrate, further including a print command generator that processes the layout information to automatically develop therefrom print commands, and the printing system prints on at least one of the first substrate and the second substrate information in accordance with the print commands.

15. The system of claim 14, wherein the print command generator combines the circuit trace information with the print commands into a single file.

16. The system of claim 11, wherein the layout information includes information regarding a location on the substrate and behavior or a sensor.

17. The system of claim 11, wherein the layout information includes information regarding an action undertaken by the electronic device in response to actuation of the sensor.

18. The system of claim 11, wherein the indicator is one of a visual indicator, an auditory indicator, or a vibration motor.

19. The system of claim 11, further including a finishing system to produce a finished electronic device, wherein the finishing system undertakes one or more of joining the substrate with another substrate, die-cutting the substrate, die-cutting the joined substrates, and creating an aperture in the substrate.

20. The system of claim 11, further including a program generator that generates from the layout information executable instructions to download to the electronic device, and a programming system that downloads the executable instructions into a memory of the electronic device.

* * * * *